(12) United States Patent
Iwano et al.

(10) Patent No.: US 9,478,879 B2
(45) Date of Patent: Oct. 25, 2016

(54) CONNECTOR ASSEMBLY AND FEMALE CONNECTOR USED FOR THE SAME

(71) Applicant: PANASONIC CORPORATION, Osaka (JP)

(72) Inventors: Hiroshi Iwano, Osaka (JP); Mitsuru Iida, Mie (JP); Daisuke Sato, Mie (JP); Hidetoshi Takeyama, Mie (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 13/935,292

(22) Filed: Jul. 3, 2013

(65) Prior Publication Data

US 2014/0017938 A1 Jan. 16, 2014

(30) Foreign Application Priority Data

Jul. 10, 2012 (JP) .................................. 2012-154693

(51) Int. Cl.
*H01R 12/79* (2011.01)
*H05K 1/11* (2006.01)
(Continued)

(52) U.S. Cl.
CPC ............ *H01R 12/613* (2013.01); *H01R 12/79* (2013.01); *H05K 1/114* (2013.01); *H05K 1/11* (2013.01);
(Continued)

(58) Field of Classification Search
CPC ...... H01R 12/613; H01R 12/79; H05K 1/14; H05K 2201/09227; H05K 2201/09709; H05K 2201/0949; H05K 2201/09672; H05K 2201/09863; H05K 2203/167; H05K 1/114; H05R 12/616
USPC ........... 439/67, 74, 75, 77, 82, 86, 586, 492, 439/493, 499
See application file for complete search history.

(56) References Cited

U.S. PATENT DOCUMENTS 6,096,411 A * 8/2000 Nakatani et al. ............. 428/209
6,163,957 A   12/2000 Jiang et al.
(Continued)

FOREIGN PATENT DOCUMENTS

JP    2000165050 A    6/2000
JP    4059522 B1    3/2008
(Continued)

OTHER PUBLICATIONS

Office Action issued in corresponding Japanese Patent Application No. 2012-154693, mailed on Sep. 6, 2016.

*Primary Examiner* — Felix O Figueroa
*Assistant Examiner* — Paul Baillargeon
(74) *Attorney, Agent, or Firm* — McDermott Will & Emery LLP

(57) ABSTRACT

A socket (female connector) used for a connector assembly includes a film substrate constituted by a flexible thin board made of insulation material. The film substrate is provided with connection through holes adapted to be inserted therein connection posts of a header (male connector). Connection pads are formed on a first surface of the film substrate around respective connection through holes. The connection pads include a first pad and a second pad. The film substrate is provided on the first surface with a first patterned conductor connected to the first pad and a third patterned conductor connected to the second pad. The third patterned conductor is connected to a second patterned conductor formed on a second surface of the film substrate by means of a blind via that is formed by boring the film substrate from the second surface so as to reach the third patterned conductor.

8 Claims, 5 Drawing Sheets

(51) Int. Cl.
  *H01R 12/61* (2011.01)
  *H05K 3/00* (2006.01)
  *H05K 3/36* (2006.01)
  *H05K 3/40* (2006.01)

(52) U.S. Cl.
  CPC ............. *H05K 1/117* (2013.01); *H05K 3/0038* (2013.01); *H05K 3/365* (2013.01); *H05K 3/4007* (2013.01); *H05K 2201/0367* (2013.01); *H05K 2201/0394* (2013.01); *H05K 2201/0949* (2013.01); *H05K 2201/0969* (2013.01); *H05K 2201/09409* (2013.01); *H05K 2201/09427* (2013.01); *H05K 2201/09445* (2013.01); *H05K 2201/09509* (2013.01); *H05K 2201/09781* (2013.01); *H05K 2201/10189* (2013.01); *H05K 2201/2009* (2013.01); *H05K 2201/2072* (2013.01); *H05K 2203/167* (2013.01)

(56) References Cited

U.S. PATENT DOCUMENTS

| | | | | |
|---|---|---|---|---|
| 6,662,443 | B2* | 12/2003 | Chou et al. | 29/852 |
| 7,062,845 | B2* | 6/2006 | Burgess | B23K 26/0626 |
| | | | | 219/121.6 |
| 7,785,113 | B2 | 8/2010 | Mizoguchi | |
| 8,708,712 | B2* | 4/2014 | Iida | 439/67 |
| 2006/0191134 | A1* | 8/2006 | Ichikawa | 29/852 |
| 2009/0233465 | A1 | 9/2009 | Mizoguchi | |
| 2011/0212631 | A1 | 9/2011 | Iida | |

FOREIGN PATENT DOCUMENTS

| | | |
|---|---|---|
| JP | 2008-091363 A | 4/2008 |
| JP | 2011181200 A | 9/2011 |
| WO | WO 2011077228 A1 * | 6/2011 |

* cited by examiner

CONNECTOR ASSEMBLY AND FEMALE CONNECTOR USED FOR THE SAME

TECHNICAL FIELD

The invention relates to a connector assembly and a female connector used for the connector assembly.

BACKGROUND ART

There has been proposed an electrical connection structure with low-height, formed by fitting together a first connection member formed of a flexible printed circuit board and a second connection member (see e.g. JP4059522B; hereinafter referred to as "Document 1").

The first connection member includes a thin insulation film having flexibility as a substrate, and pads formed on one surface (front surface) of the insulation film. Each of pads has elasticity and electrical conductivity. The insulation film is provided with through holes piercing the insulation film in the thickness direction. Each through hole is formed at a place of a corresponding pad. Each pad is provided with a pinhole communicating the corresponding through hole.

The second connection member has conductive protrusions each of which is shaped like a column. Each conductive protrusion is formed at a position facing a corresponding pad of the first connection member, and is adapted to be inserted into the pinhole of the corresponding pad.

When the first connection member is connected with the second connection member, columnar-shaped conductive protrusions are inserted into the pinholes of the respective pads. In this time, the pads are pressed by the conductive protrusions to be bent into the insertion direction of the conductive protrusions, and are made in elastic contact with the conductive protrusions by the restoring forces of the pads.

Recently, electronic devices have been desired to be more downsized, and electric components have been desired to be densely packed in a package. Therefore, there has been demanded an electrical connection structure having multiple electrical connections and having a compact size. In the electrical connection structure disclosed in Document 1, the plurality of pads are formed on one surface of the insulation film, and the plurality of conductive protrusions are formed on one surface (surface facing the plurality of pads) of the second connection member. In order to achieve an electrical connection structure having multiple electrical connections in a compact size, the plurality of pads (and the plurality of conductive protrusions) should be arranged in high density. In a configuration where the plurality of pads are arranged densely with a narrow pitch, a plurality of patterned conductors (circuit patterns) each extends toward outside from a corresponding pad cannot be tracked on only the one surface of the insulation film.

Considering this problem, it may be considered to form patterned conductors on the other surface (back surface) of the insulation film, and to connect each patterned conductor on the other surface with a corresponding pad on the one surface by means of a plated through hole. However, in this case, in order to electrically connect a patterned conductor on the front surface and a patterned conductor on the back surface with each other by means of a plated through hole, it needs to form a through hole in the insulation film and then to form plating on the inner surface of the through hole. In this process, a plated layer is formed not only on the back surface of the insulation film but also the front surface of the insulation film. It is therefore the thickness of each pad increases by the plate layer, and the pads become less likely to be bent. Therefore, there is a problem in this configuration that a relatively large stress is occurring in the pad when the pad is bent by the conductive protrusion.

DISCLOSURE OF THE INVENTION

The invention is developed in view of above circumstances, and it is an object of the invention to provide a connector assembly which has a compact size and which is capable of reducing stress applied on spring portion bent by a conductive protrusion when a socket is connected with a header, and to provide a female connector (header) used for the connector assembly.

A connector assembly of the invention includes a female connector and a male connector. The female connector includes a film substrate and pads. The film substrate is constituted by a flexible thin board made of insulation material and provided with through holes each penetrating the film substrate in the thickness direction. The pads have electrical conductivity and are formed on a first surface of the film substrate around the respective through holes. The male connector includes conductive protrusions. Each of the conductive protrusions is adapted to be inserted into a corresponding through hole to push and elastically deform periphery of the through hole, thereby being electrically connected with a corresponding pad, when the male connector is connected with the female connector. The pads include at least one first pad and at least one second pad. The film substrate is provided on the first surface with at least one first patterned conductor each of which is electrically connected with a corresponding first pad, and at least one third patterned conductor each of which is electrically connected with a corresponding second pad. The film substrate is provided on a second surface with at least one second patterned conductor each of which is electrically connected with a corresponding third patterned conductor. Each third patterned conductor is electrically connected to a corresponding second patterned conductor by means of a blind via that is formed by boring the film substrate from the second surface so as to reach the third patterned conductor.

In one embodiment, the through holes are arranged in the film substrate along a plurality of rows. The pads are formed to the respective through holes.

In one embodiment, the female connector further includes a reinforcing plate fixed to the second surface of the film substrate. The reinforcing plate is adhered to the film substrate by means of epoxy adhesive.

A female connector of the invention is used for any one of the above connector assembly. The female connector includes a film substrate and pads. The film substrate is constituted by a flexible thin board made of insulation material and provided with through holes each penetrating the film substrate in the thickness direction. The pads have electrical conductivity and are formed on a first surface of the film substrate around the respective through holes. The pads include at least one first pad and at least one second pad. The film substrate is provided on the first surface with at least one first patterned conductor each of which is electrically connected with a corresponding first pad, and at least one third patterned conductor each of which is electrically connected with a corresponding second pad. The film substrate is provided on a second surface with at least one second patterned conductor each of which is electrically connected with a corresponding third patterned conductor. Each third patterned conductor is electrically connected to a corresponding second patterned conductor by means of a blind via that is formed by boring the film substrate from the second surface so as to reach the third patterned conductor.

According to the connector assembly of the invention, it is possible to realize an electrical connection structure having multiple electrical connections and having a compact size. In addition, in the connector assembly, each third patterned conductor formed on the first surface (front surface) of the film substrate is electrically connected to a corresponding second patterned conductor formed on the second surface (back surface) of the film substrate by means of a blind via that is formed from the second surface (back surface) of the film substrate. Since the blind via does not pierce the film substrate, a mask layer can be formed on the first surface (front surface) of the film substrate after boring the film substrate from the second surface (back surface) side so as to reach and not to pierce the third patterned conductor, before plating the inside surface of the blind via. That is, the film substrate can be subjected the plating process under the condition where a mask is provided on the first surface (front surface). Accordingly, the pads formed on the first surface (front surface) of the film substrate around the through holes are not plated (i.e. plated layer is not formed on the pads), and therefore the pads are prevented from being thickened by the plated layer. As a result, the pads can be freely bent when the female connector is connected to the male connector, and accordingly it is possible to reduce the stress occurring in the pads when the pads are bent by the conductive protrusions.

According to the female connector of the invention, it is possible to realize an electrical connection structure having multiple electrical connections and having a compact size. In addition, in the female connector, each third patterned conductor formed on the first surface (front surface) of the film substrate is electrically connected to a corresponding second patterned conductor formed on the second surface (back surface) of the film substrate by means of a blind via that is formed from the second surface (back surface) of the film substrate. Since the blind via does not pierce the film substrate, a mask layer can be formed on the first surface (front surface) of the film substrate after boring the film substrate from the second surface (back surface) side so as to reach and not to pierce the third patterned conductor, before plating the inside surface of the blind via. That is, the film substrate can be subjected the plating process under the condition where a mask is provided on the first surface (front surface). Accordingly, the pads formed on the first surface (front surface) of the film substrate around the through holes are not plated (i.e. plated layer is not formed on the pads), and therefore the pads are prevented from being thickened by the plated layer. As a result, the pads can be bent freely when the female connector is connected to a male connector, and accordingly it is possible to reduce the stress occurring in the pads when the pads are bent by the conductive protrusions.

DESCRIPTION OF THE EMBODIMENT

Figure 2:
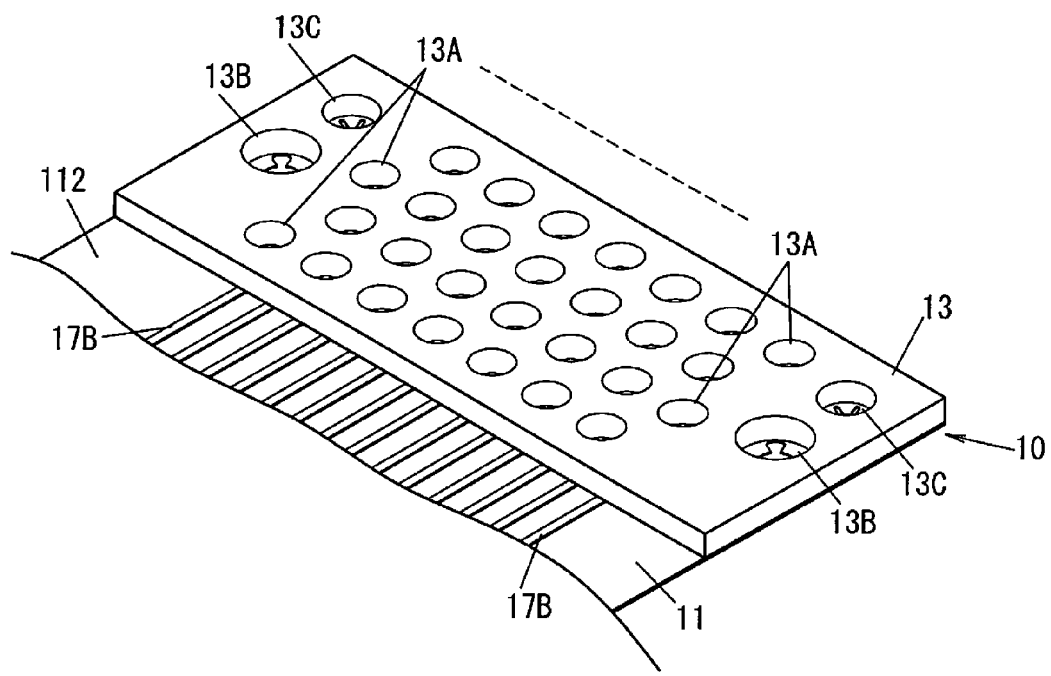
FIG. 2 is a perspective view of the connector assembly according to the embodiment with the socket separated from a header.
Figure 2:
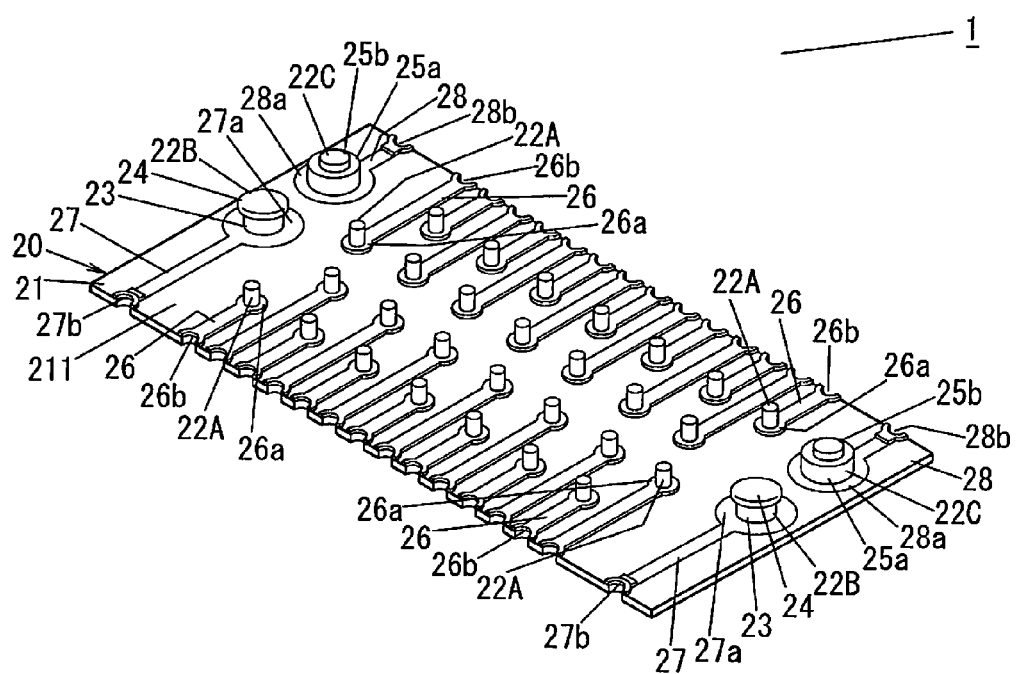

As shown in FIG. 2, a connector assembly 1 of the embodiment includes a socket 10 (female connector) and a header 20 (male connector), which are configured to be mechanically and electrically connected with each other. The connector assembly 1 is used for mechanically and electrically connecting a pair of circuit boards with each other. For example, the socket 10 may be mounted on a circuit board (not shown) formed of a flexible substrate, and the header 20 may be mounted on a circuit board (not shown) formed of a rigid substrate. Two of the circuit boards can be mechanically and electrically connected with each other by connecting the socket 10 with the header 20. Note that, the socket 10 has a width (along upper left-lower right direction in FIG. 2) and a length (along upper right-lower left direction in FIG. 2) and a thickness (perpendicular to the width and the length), and the header 20 has a width (along upper right-lower left direction in FIG. 2) and a length (along upper left-lower right direction in FIG. 2) and a thickness (perpendicular to the width and the length). The socket 10 is attached to the header 20 so that the width direction of the socket 10 aligns with the longitudinal direction of the header 20 (the longitudinal direction of the socket 10 aligns with the width direction of the header 20).

The socket 10 includes a film substrate 11, pads 12, and a reinforcing plate 13. The film substrate 11 is shaped like a rectangular board (or sheet). The pads 12 include connection pads (pad for electrical connection) 12A, attachment pads (pad for mechanical connection) 12B, and positioning pads (pad for relative positioning) 12C. Each pad 12 is made of electrically conductive material.

The header 20 includes a header substrate 21, and posts 22. The header substrate 21 is shaped like a longitudinal rectangular board. The posts 22 include connection posts (post for electrical connection) 22A, attachment posts (post for mechanical connection) 22B, and positioning posts (post for relative positioning) 22C. Each post 22 is made of electrically conductive material.

The structure of the header 20 is described first with reference to FIG. 2.

The header substrate 21 s formed of a rigid substrate made of insulation material, such as an epoxy glass substrate (e.g. FR4). The header substrate 21 is provided with the posts 22 (connection posts 22A, attachment posts 22B, and positioning posts 22C) protruded from a surface 211 (first surface; upper surface) of the header substrate 21 facing the socket 10. Each post 22 protrudes upward (toward the socket 10) on the first surface 211.

Each connection post 22A is made of electrically conductive material. Each connection post 22A is formed in a shape of a column of which cross section parallel to the first surface 211 of the header substrate 2 is circular in shape and substantially constant diameter for the entire length along the upright direction (i.e. the direction orthogonal to the first surface 211 of the header substrate 21). In the embodiment, the header 20 includes the connection posts 22A in sets of two or more (e.g., 2), and two or more (e.g., 14) sets of connection posts 22A are arranged on the header substrate 21 along the longitudinal direction so that all of the connection posts 22A are spaced at predetermined intervals in the width and longitudinal directions, respectively. The sets of connection posts 22A that are arranged along the longitudinal direction each have two connection posts 22A arranged apart from each other in the width direction, so that all of the connection posts 22A are arranged in a staggered array. As a result, the connection posts 22A are arranged on the first surface 211 of the header substrate 21 along four lines, and seven of connection posts 22A are arranged along each line. This arrangement allows to widen the intervals among adjacent connection posts 22A while allows to reduce the surface area of a region where the connection posts 22A are arranged.

The header 20 includes two attachment posts 22B and two positioning posts 22C. Two attachment posts 22B are arranged on the first surface 211 at respective sides in the longitudinal direction of the header substrate 21 so that the fourteen sets (i.e. all) of the connection posts 22A intervene between the attachment posts 22B. Two positioning posts 22C are arranged on the first surface 211 at respective sides in the longitudinal direction of the header substrate 21 so that the fourteen sets of the connection posts 22A intervene between the positioning posts 22C. In other words, the connection posts 22A are arranged in a staggered array in a region intervening between the pair of the attachment posts 22B as well as between the pair of the positioning posts 22C in the longitudinal direction on the first surface 211 of the header substrate 21. Each of the attachment posts 22B is placed around the center in the width direction on the first surface 211 of the header substrate 21. Each of the positioning posts 22C is placed nearer one end with respect to the center in the width direction on the first surface 211 of the header substrate 21.

Each attachment post 22B has a neck portion 23 and a head portion 24. The neck portion 23 is shaped like a column and protruded from the first surface 211 of the header substrate 21. The head portion 24 is formed continuously on a top of the neck portion 23. Each of the neck portion 23 and the head portion 24 is circular in shape in cross section parallel to the first surface 211 of the header substrate 21. The head portion 24 has a maximum diameter larger than that of the neck portion 23. That is, the head portion 24 at the tip side of the attachment post 22B is thicker than the neck portion 23 at the base side thereof, and thereby the attachment post 22B is shaped like a mushroom. The head portion 24 is tapered so as to become gradually narrower with distance from the neck portion 23.

Each positioning post 22C integrally has a large diameter portion 25a and a small diameter portion 25b. The large diameter portion 25a is shaped like a column and protruded from the first surface 211 of the header substrate 21. The small diameter portion 25b is protruded continuously from a top of the large diameter portion 25a. The small diameter portion 25b is shaped like a column having the same center with the large diameter portion 25a. The small diameter portion 25b has a smaller diameter than the large diameter portion 25a.

In the embodiment, a protrusion length (height) from the first surface 211 of the attachment post 22B and that of the positioning post 22C are set to be larger than that of the connection post 22A. A protrusion length (height) of the neck portion 23 of the attachment post 22B (i.e. height except for the head portion 24) is set to be larger than the height of the connection post 22A. The height of the neck portion 23 of the attachment post 22B is set to be slightly larger than the height of the large diameter portion 25a of the positioning post 22C. Note that, relationship between these heights is not limited thereto. For example, the height of the connection post 22A may be larger than the height of the neck portion 23.

As shown in FIG. 2, the header substrate 21 is provided with patterned conductors (circuit patterns) 26, 27, 28 on the first surface 211. The header substrate 21 is provided with lands 26a, 27a, 28a on the first surface 211 as well. The conductive patterns 26 and the lands 26a correspond to the connection posts 22A, respectively, the conductive patterns 27 and the lands 27a correspond to the attachment posts 22B, respectively, and the conductive patterns 28 and the lands 28a correspond to the positioning posts 22C, respectively. Each connection post 22A is formed on a corresponding land 26a, each attachment post 22B is formed on a corresponding land 27a, and each positioning post 22C is formed on a corresponding land 28a. The header substrate 21 is provided with edge-through holes (plated recesses) 26b, 27b, 28b each formed at either a first end (upper right end in FIG. 2) or a second end (lower left end in FIG. 2) in the width direction of the header substrate 21. The edge-through holes 26b correspond to the connection posts 22A, respectively, the edge-through holes 27b correspond to the attachment posts 22B, respectively, and the edge-through holes 28b correspond to the positioning posts 22C, respectively.

Each patterned conductor 26 is formed so as to connect a corresponding land 26a that is shaped like a circle and formed under a connection post 22A, and a corresponding edge-through hole 26b formed at the first or second end, which is nearer end to the land 26a, in the width direction of the header substrate 21. Each patterned conductor 27 is formed so as to connect a corresponding land 27a that is shaped like a circle and formed under an attachment post 22B, and a corresponding edge-through hole 27b formed at the second end (end opposite of the attachment post 22B from the positioning post 22C) in the width direction of the header substrate 21. Each patterned conductor 28 is formed so as to connect a corresponding land 28a that is shaped like a circle and formed under a positioning post 22C, and a corresponding edge-through hole 28b formed at the first end in the width direction of the header substrate 21. Each of the edge-through holes 26b, 27b, 28b is formed by plating a semi-columnar recess formed at an end face of the header substrate 21 with electrically conductive material. The edge-through holes 26b, 27b, 28b are employed to mount the header substrate 21 on a circuit board (not shown).

The structure of the socket 10 is then described with reference to FIGS. 2 to 6.

The film substrate 11 is formed of a flexible substrate for assembling a printed circuit (FPCB: flexible printed circuit board). The film substrate 11 is made of insulation material (e.g. polyimide resin; PI) to be shaped like a thin board (sheet) having flexibility.

Figure 3:
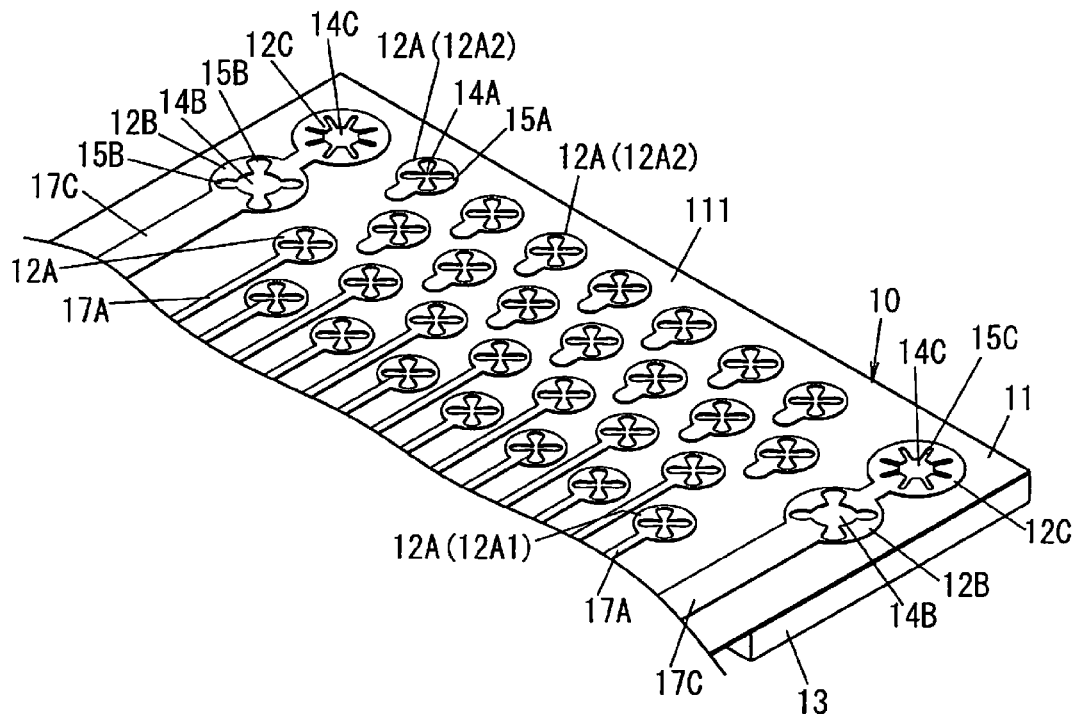
FIG. 3 is a perspective view of the socket used in the connector assembly according to the embodiment as viewed from a first surface side.
Figure 4:
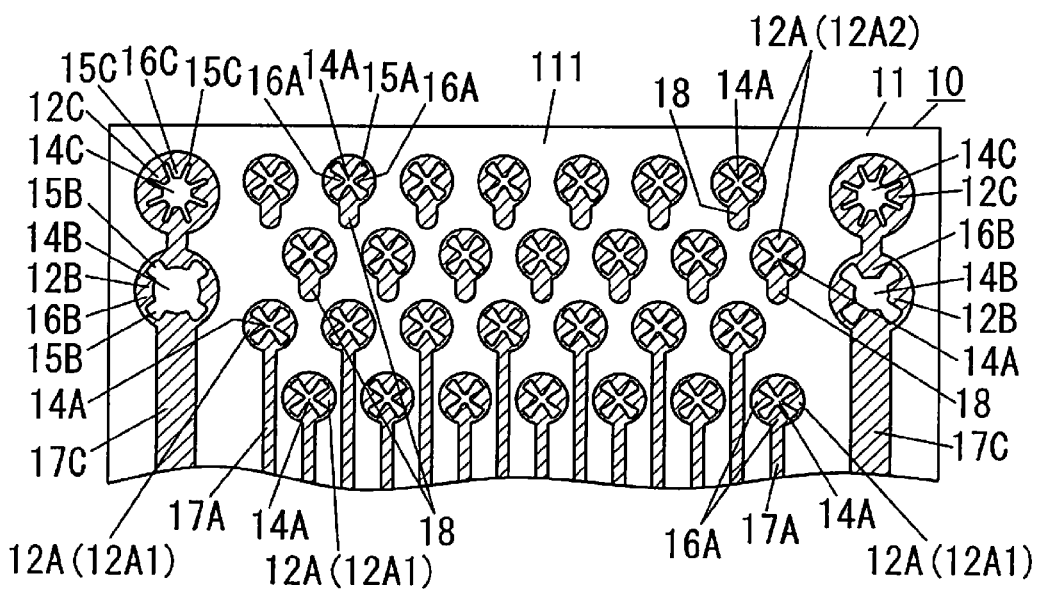
FIG. 4 is a plan view of the socket used in the connector assembly according to the embodiment as viewed from the first surface side.
Figure 6:
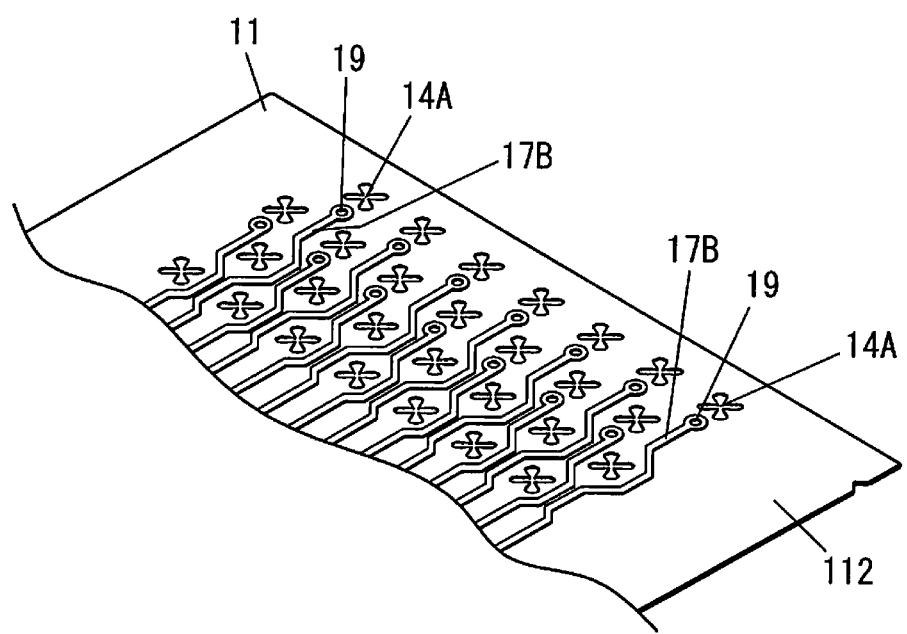
FIG. 6 is a schematic perspective view of a film substrate of the socket (note that illustration of attachment and positioning through holes are omitted) used in the connector assembly according to the embodiment as viewed from a second surface side.

As shown in FIGS. 3, 4, and 6, the film substrate 11 is provided with through holes 14 each pierced in the film substrate 11 in the thickness direction. The through holes 14 are placed at positions corresponding to the posts 22, respectively, and to be inserted therein the posts 22 when the socket 10 is attached to the header 20. The through holes 14 includes: connection through holes 14A formed at positions of the respective connection posts 22A; attachment through holes 14B formed at positions of the respective attachment posts 22B; and positioning through holes 14C formed at positions of the respective positioning posts 22C.

Each of the connection through holes 14A is formed at a position corresponding to a connection post 22A, and accordingly the connection through holes 14A are arranged in a staggered array as with the connection posts 22A. The socket 10 includes two attachment through holes 14B and two positioning through holes 14C. Two attachment through holes 14B are formed on respective sides in the width direction of the film substrate 11 so that the connection through holes 14A intervene between the attachment through holes 14B. Two positioning through holes 14C are formed on respective sides in the width direction of the film substrate 11 so that the connection through holes 14A intervene between the positioning through holes 14C.

Each connection through hole 14A is circular in shape, and has a diameter smaller than the diameter of the connection post 22A. The film substrate 11 is further provided with slots 15A in sets of four, corresponding to each of the connection through holes 14A. Four slots 15A corresponding to each connection through hole 14A are pierced in the film substrate 11 in the thickness direction and extend radially from a corresponding connection through hole 14A. The four slots 15A cross each other at approximately right angle at a position of a corresponding connection through hole 14A. The connection through hole 14A and the four slots 15A constitute an opening shaped like a cross having a maximum length larger than the diameter of the connection post 22A (i.e. distance between outside ends of the slots 15A is larger than the diameter of the connection post 22A). Therefore, four spring pieces 16A divided by the four slots 15A are provided around each connection through hole 14A (see FIG. 4).

Each attachment through hole 14B is circular in shape, and has a diameter smaller than the diameter of the neck portion 23 of the attachment post 22B. The film substrate 11 is further provided with slots 15B in sets of four, corresponding to each of the attachment through holes 14B. Four slots 15B corresponding to each attachment through hole 14B are pierced in the film substrate 11 in the thickness direction and extend radially from a corresponding attachment through hole 14B. The four slots 15B cross each other at approximately right angle at a position of a corresponding attachment through hole 14B. The attachment through hole 14B and the four slots 15B constitute an opening shaped like a cross having a maximum length larger than the diameter of the head portion 24 (i.e. distance between outside ends of the slots 15B is larger than the diameter of the head portion 24). Therefore, four spring pieces 16B divided by the four slots 15B are provided around each attachment through hole 14B.

Each positioning through hole 14C is circular in shape, and has a diameter smaller than the diameter of the large diameter portion 25a of the positioning post 22C. The film substrate 11 is further provided with slots 15C in sets of eight, corresponding to each of the positioning through holes 14C. Eight slots 15C corresponding to each positioning through holes 14C are pierced in the film substrate 11 in the thickness direction and extend radially with equally-angled from a corresponding positioning hole 14C. Therefore, eight spring pieces 16C divided by the slots 15C are provided around each positioning through hole 14C. The positioning through hole 14C and the slots 15C constitute an opening having a maximum length larger than the diameter of the large diameter portion 25a.

Note that, the attachment through holes 14B, the positioning through holes 14C, slots 15B and 15C are not shown in FIG. 6.

The film substrate 11 is provided with pads 12 on a first surface 111 (front surface; surface facing the header 20; reverse side surface in FIG. 2) around respective through holes 14. Each pad 12 is formed at a corresponding position of a post 22, is formed of electrically conductive material, and is shaped like a circle around a corresponding through hole 14.

Each pad (connection pad) 12A is formed on the first surface 111 of the film substrate 11 at a position around a corresponding connection through hole 14A, and adapted to be electrically connected to a corresponding connection post 22A. The pad 12A is formed by processing a copper layer in a base member of the film substrate 11 with a laser. Each pad 12A is formed on the whole of the periphery of an opening constituted by a connection through hole 14A and slots 15A. In the embodiment, the connection pads 12A are arranged at one end (first end; upper right end in FIG. 4) in the longitudinal direction of the film substrate 11 in four rows each of which includes seven connection pads 12A. In each row, seven connection pads 12A are aligned along the end side of the first end of the film substrate 11.

With regard to the pads 12A arranged in four rows, the pads 12A (first pads 12A1) in two rows (lower ones in FIG. 3), which are arranged far from the first end of the film substrate 11, are connected to first patterned conductors 17A formed on the first surface 111 of the film substrate 11, respectively. As seen from the figure, there remains no space on the first surface 111 of the film substrate 11 for forming patterned conductors adapted for the pads 12A (second pads 12A2) in another two rows (upper ones in FIG. 3), since the film substrate 11 has a compact size. In the embodiment therefore, each of the second pads 12A2 in the two rows arranged near the first end of the film substrate 11 is connected to a second patterned conductor 17B formed on a second surface 112 (back surface; front side surface in FIG. 2) of the film substrate 11 by means of a blind via (plated blind hole) 19, where the blind via 19 being formed from the second surface (112) side of the film substrate 11. Each blind via 19 is formed adjacent to a corresponding second pad 12A2, and is connected thereto by means of a corresponding third patterned conductor 18 formed on the first surface 111.

In other words, the film substrate 11 is provided with the pads 12A on the first surface 111. The pads 12A include at least one first pad 12A1 and at least one second pad 12A2. Each first pad 12A1 is electrically connected to a corresponding first patterned conductor 17A formed on the first surface 111 of the film substrate 11. Each first patterned conductor 17A extends from a corresponding first pad 12A1 toward one end side (lower side in FIG. 4) of the film substrate 11. Each second pad 12A2 is electrically connected to a corresponding third patterned conductor 18 formed on the first surface 111 of film substrate 11. The film substrate 11 is provided on the second surface 112 with at least one second patterned conductor 17B that respectively corresponds to the at least one second pad 12A2. Each third patterned conductor 18 is electrically connected with a corresponding second patterned conductor 17B by means of a blind via 19 formed from the second surface (112) side of the film substrate 11. Each second patterned conductor 17B extends from a corresponding blind via 19 toward the one end side (lower side in FIG. 4; same side with the extending direction of the first patterned conductor 17A) of the film substrate 11.

As similar with the connection pads 12A, each pad (attachment pad) 12B is formed on the first surface 111 of the film substrate 11 at a position around a corresponding attachment through hole 14B, and adapted to be electrically connected to a corresponding attachment post 22B. The pad 12B is formed by processing the copper layer in the base member of the film substrate 11 with a laser. Also, each pad (positioning pad) 12C is formed on the first surface 111 of the film substrate 11 at a position around a corresponding positioning through hole 14C, and adapted to be electrically connected to a corresponding positioning post 22C. The pad 12C is formed by processing the copper layer in the base member of the film substrate 11 with a laser. The pads 12B and 12C provided at a first side (left side in FIG. 4) in the width direction of the film substrate 11 are commonly connected to a patterned conductor 17C (first patterned conductor) formed at the first side (left side in FIG. 4) in the width direction of the film substrate 11. The pads 12B and 12C provided at a second side (right side in FIG. 4) in the width direction of the film substrate 11 are commonly connected to a patterned conductor 17C (first patterned conductor) formed at the second side (right side in FIG. 4) in the width direction of the film substrate 11.

Note that, the pads 12B, 12C and the patterned conductors 17C can be omitted from the socket 10 if the attachment posts 22B and the positioning posts 22C are not intended to be used for electrical connection.

Next, it is described one method for producing a second pad 12A2 that is electrically connected to a second patterned conductor 17B on the second surface 112 of the film substrate 11 by means of a blind via 19, with referring FIGS. 1A to 1E.

Figure 1A:
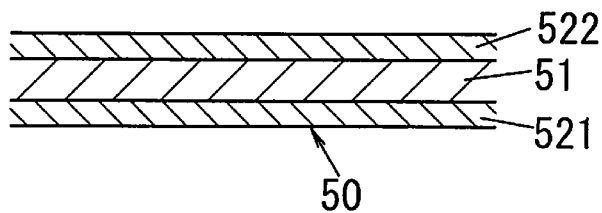
FIGS. 1A to 1E are sectional diagrams for illustrating a production process of a socket used in a connector assembly according to an embodiment.

As shown in FIG. 1A, a base substrate 50 as a base member of the film substrate 11 has a three-layer structure composed of an inner layer 51 and copper layers 521 and 522 laminated on the respective surfaces of the inner layer 51. The inner layer 51 is made of synthetic resin (e.g. polyimide resin) having insulation property. In the embodiment, each of the copper layers 521, 522 has a thickness of about 9 μm.

Figure 1B:
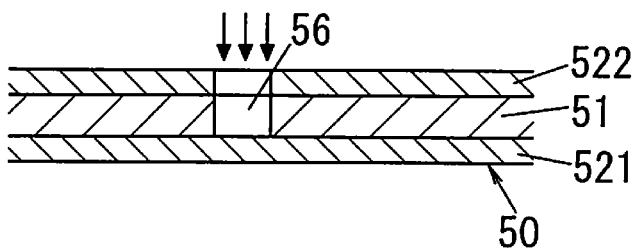

As shown in FIG. 1B, the base substrate 50 is irradiated with laser from an upper surface side (side which will form the second surface 112 of the film substrate 11), thereby being formed with a blind hole (depression) 56, as a basis of the blind via 19, so as to reach (and not to pierce) the lower copper layer 521. When the hole-forming step is finished, the lower copper layer 521 is exposed as the bottom of the blind hole 56. In the hole-forming step with the laser, output power of the laser irradiated to the base substrate 50 is adjusted so that the blind hole 56 reaches the lower copper layer 521 as well as the lower copper layer 521 is not pierced.

Figure 1C:
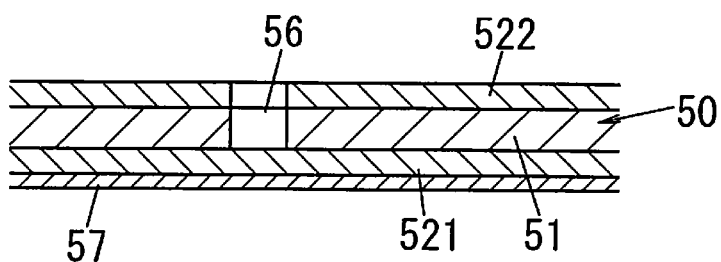
Figure 1D:
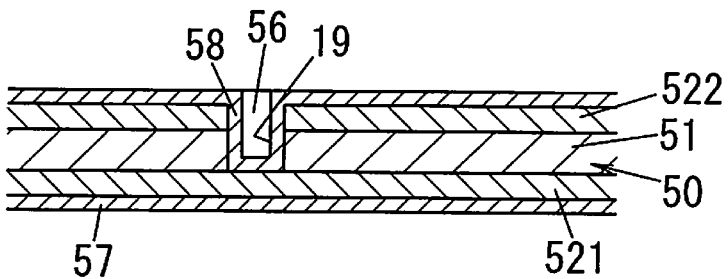
Figure 1E:
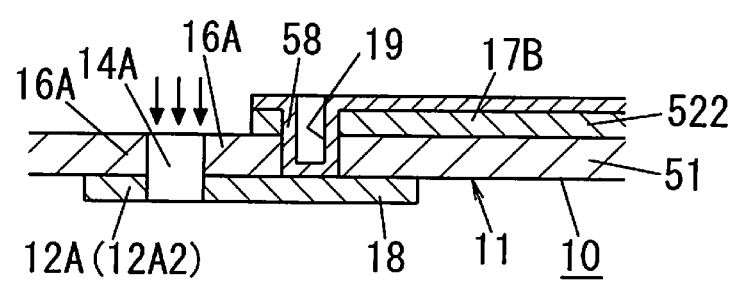

As shown in FIG. 1C, a mask layer 57 is then formed on a lower surface side (side which will form the first surface 111 of the film substrate 11) of the base substrate 50. The base substrate 50 is then processed copper plating, and thereby a copper plated layer 58 is formed on the upper surface of the base substrate 50 and on the inner surface of the blind hole 56, as shown in FIG. 1D. In this plating step, the plated layer 58 is formed across over the inner side surface and the bottom surface of the blind hole 56. Therefore, the upper copper layer 522 and the lower copper layer 521 are electrically connected by means of the blind via 19 composed of the plated layer 58 formed over the inner side and the bottom of the blind hole 56.

The mask layer 57 on the lower surface of the base substrate 50 is then removed, and then the upper and lower surfaces of the base substrate 50 are patterned with a laser. By the patterning processing by the laser, the through hole 14A and the set of the slots 15A penetrating the film substrate 11 are formed in the film substrate 11; the pad 12A2 and the patterned conductor (third patterned conductor 18) continuing the pad 12A2 are formed on the first surface (lower surface in FIG. 1E) 111 of the film substrate 11; and the patterned conductor (second patterned conductor 17B) continuing with the blind via 19 is formed on the second surface (upper surface in FIG. 1E) 112 of the film substrate 11. The third patterned conductor 18 is formed at a position in contact with the bottom of the blind via 19, and thereby the second patterned conductor 17B on the second surface 112 and the third patterned conductor 18 on the first surface 111 are electrically connected with each other by means of the blind via 19.

With regard to one side, which constitutes the first surface 111 of the film substrate 11, of the base member 50, the copper layer 521 on its surface is patterned to remove a portion other than the pads 12A to 12C and the patterned conductors 17A, 17C and 18, and thereby the pads 12A to 12C and the patterned conductors 17A, 17C and 18 are formed. With regard to the other side, which constitutes the second surface 112 of the film substrate 11, of the base member 50, the copper layer 522 on its surface and the plated layer 58 deposited on the copper layer 522 are patterned to remove a portion other than the patterned conductors 17B, and thereby the patterned conductors 17B are formed. With regard to each positions of the pads 12A, 12B, 12C, the through hole 14A, 14B, 14C and the slots 15A, 15B, 15C are formed so as to penetrate through the inner layer 51 and the lower copper layer 521 by the laser processing, and thereby the spring pieces 16A, 16B, 16C separated by the slots 15A, 15B, 15C are formed.

According to the above producing method, each third patterned conductor 18 (connected to the pad 12A2) on the first surface 111 and a corresponding second patterned conductor 17B on the second surface 112 are electrically connected with each other by means of a blind via 19. In this producing method, the blind hole 56 is formed from the upper surface of the base substrate 50 so as to reach the lower copper layer 521, and the inner side surface and the bottom surface of the blind hole 56 are plated, and thereby the blind via 19 is formed to electrically connect the upper copper layer 522 and the lower copper layer 521.

Described in other words, a producing method of the socket 10 (female connector) of the embodiment includes: a step of preparing the base member 50 that includes the insulation substrate (inner layer) 51 and conductive layers (copper layers) 521, 522 disposed respectively on a first surface and a second surface of the insulation substrate 51; a step of forming blind holes 56 each penetrating both the conductive layer 522 of the second surface side and the insulation substrate 51 but not penetrating the conductive layer 521 of the first surface side, thereby exposing the first surface side conductive layer 521 through the blind holes 56; a step of forming the mask layer 57 on the first surface side of the base substrate 50 (i.e. on the conductive layer 521 of the first surface side); a step of plating the inner surfaces of the blind holes 56 to form the blind vias 19 for electrically connecting the first surface side conductive layer 521 and the second surface side conductive layer 522; a step of removing the mask layer 57; a step of forming the through holes 14A, 14B, 14C; a step of patterning the first surface side conductive layer 521 to form the pads 12A, 12B, 12C, the first patterned conductors 17A, 17C and the third patterned conductors 18 of desired shapes; and a step of patterning the second surface side conductive layer 522 and the plated layer 58 on the second surface side conductive layer 522 to form the second patterned conductors 17B of desired shapes.

It is preferred that the blind hole 56 is formed by irradiating laser.

Here, it is described a method for electrically connecting the copper layers 521, 522 by means of a plated through hole as a comparative example, with referring FIGS. 7A to 7D.

Figure 7A:
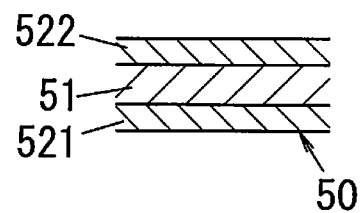
FIGS. 7A to 7D are sectional diagrams for illustrating a production process of a socket according to a comparative example.
Figure 7B:
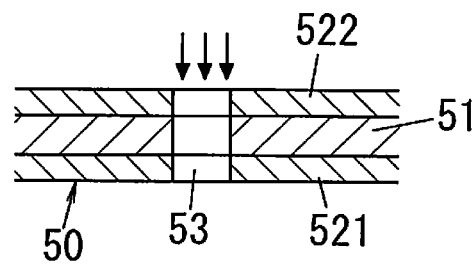
Figure 7C:
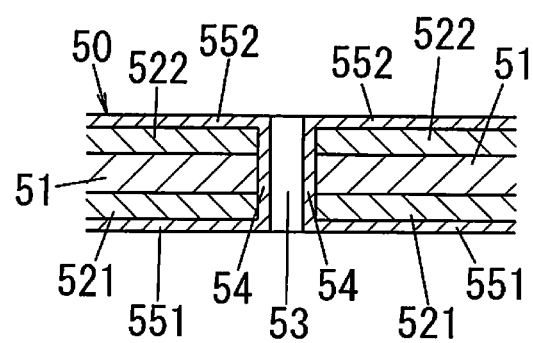
Figure 7D:
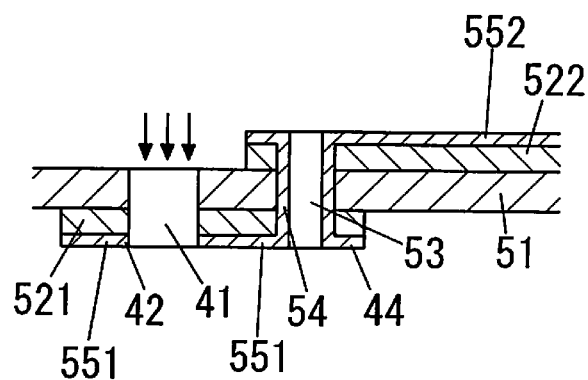

As shown in FIG. 7A, a base substrate 50 as a base member of a film substrate has a three-layer structure composed of an inner layer 51 made of polyimide (PI) resin and copper layers 521 and 522 laminated on the respective surfaces of the inner layer 51. As shown in FIG. 7B, the base substrate 50 is irradiated with laser to form a through hole 53 penetrating the base substrate 50. The through hole 53 is then plated to form plated layers 54 on the inner surface of the through hole 53 and form a plated through hole 44, and thereby the copper layers 521 and 522 are electrically connected with each other, as shown in FIG. 7C. In this time, plated layers 551 and 552 are also formed on respective surfaces of the copper layers 521 and 522. The upper and lower surfaces of the base member 50 is then processed with a laser, and thereby a through hole 41 penetrating the inner layer 51 is formed; a lower side patterned conductor is formed on the lower surface of the inner layer 51 by removing a portion other than around the through hole 41 of the copper layer 521 and the plated layer 551; and an upper side patterned conductor is formed on the upper surface of the inner layer 51 by removing a portion of the copper layer 522 and the plated layer 552 of the upper side.

In the comparative example shown in FIGS. 7A to 7D, each pad 42 formed on the lower surface of the film substrate and a corresponding patterned conductor formed on the upper surface are electrically connected with each other by means of a plated through hole. The comparative example therefore cannot form a mask layer on the lower layer of the base member 50 when plating the through hole, and therefore the plated layer 551 is then be formed on each of the pads 42. That is, in the comparative example, plated layers 551 and 552 are formed on respective surfaces during the forming step of the plated through hole 44. In the comparative example therefore, the thickness of the pad 42 is sum of the thicknesses of the copper layer 521 and the plated layer 551.

On the contrary, in the connector assembly 1 of the embodiment, the blind vias 19 electrically connect the upper side copper layer 522 and the lower side copper layer 521, respectively, and accordingly the present embodiment enables to form a mask layer 57 on the lower surface side (side which will form the first surface 111 of the film substrate 11) of the base member 50 when forming the blind vias 19 (i.e. when plating the base substrate 50). In the embodiment therefore, a copper plated layer is not formed on each pad 12A, and the pad 12A is prevented from being thickened by the plated layer, unlike the comparative example. As a result, the spring pieces 16A on which the pad 12A is formed can be bent freely compared with the comparative example, and accordingly the present embodiment can reduce the stress applied on the spring pieces 16A when the spring pieces 16A is pushed to be bent by the connection post 22A.

The reinforcing plate 13 is made of e.g. nickel silver to be shaped like a rectangular board having similar width and length with those of the header substrate 21. The reinforcing plate 13 is pasted (fixed) on a back of a surface of the film substrate 11 facing the header 20 (i.e. on the second surface 112 of the film substrate 11).

The reinforcing plate 13 is provided with through holes 13A at positions of the respective connection through holes 14A so that each through hole 13A has the same center with a corresponding connection through hole 14A. Each of the through holes 13A penetrates the reinforcing plate 13 in the thickness direction. Each through hole 13A has an internal diameter larger than an internal diameter of a corresponding connection through hole 14A as well as larger than an outer diameter of a corresponding connection post 22A. The diameter of the through hole 13A is smaller than the diameter of a corresponding pad 12A. The connection pad 12A placed on each periphery of the connection through hole 14A is extended inward from an inner circumference of a corresponding hole 13A (see FIGS. 2 and 5).

The reinforcing plate 13 is provided with two through holes 13B at positions of the respective attachment through holes 14B and two through holes 13C at positions of the respective positioning through holes 14C. Each of the through holes 13B and 13C penetrates the reinforcing plate 13 in the thickness direction. Each through hole 13B has the same center with a corresponding attachment through hole 14B. Each through hole 13B has an internal diameter larger than an internal diameter of a corresponding attachment through hole 14B as well as larger than an outer diameter of a corresponding attachment post 22B (head portion 24). The diameter of the through hole 13B is smaller than the diameter of a corresponding pad 12B. The attachment pad 12B placed on each periphery of a corresponding attachment through hole 14B is extended inward from an inner circumference of a corresponding through hole 13B. Each through hole 13C has the same center with a corresponding positioning through hole 14C. Each through hole 13C has an internal diameter larger than an internal diameter of a corresponding positioning through hole 14C as well as larger than an outer diameter of a corresponding positioning post 22C (large diameter portion 25a). The diameter of the through hole 13C is smaller than the diameter of a corresponding pad 12C. The positioning pad 12C placed on each periphery of a corresponding positioning through hole 14C is extended inward from an inner circumference of a corresponding through hole 13C.

When the socket 10 is attached to the header 20, the connection posts 22A are inserted into the respective through holes 13A through the respective connection through holes 14A, and the connection pads 12A come into contact with the respective side surfaces of the connection posts 22A; the attachment posts 22B are inserted into the respective through holes 13B through the respective attachment through holes 14B, and the attachment pads 12B come into contact with the respective side surfaces of the neck portions 23; and the positioning posts 22C are inserted into the respective through holes 13C through the respective positioning through holes 14C, and the positioning pads 12C come into contact with the respective side surfaces of the large diameter portions 25a.

Note that, material, thickness, and the like of the pad 12 are chosen and decided so that the pad 12 has elasticity (shape-restoring force) as well as electric conductivity. Accordingly, elasticity is given to at least regions in the film substrate 11 at which the pads 12 are formed. That is, the film substrate 11 includes spring pieces 16 (including spring pieces 16A, 16B, 16C) each of which is extended inward from an inner circumference of a corresponding through hole 13A, 13B, 13C. The pads 12A, 12B, 12C are formed on the spring pieces 16A, 16B, 16C, respectively.

The reinforcing plate 13 is preferably adhered to the film substrate 11 by means of epoxy adhesive (epoxide-based adhesive). Use of the epoxy adhesive enables to firmly adhere the reinforcing plate 13 and the film substrate 11, in particular, to firmly adhere the inner circumference of each through hole 13A, 13B, 13C to corresponding portion of the film substrate 11 (i.e. root portion of the spring piece 16A, 16B, 16C; note that, elasticity of the spring piece 16A, 16B, 16C (elasticity of the pad 12A, 12B, 12C) is susceptible to adhesion of the root portion), thereby preventing the film substrate 11 from causing abrasion. This configuration therefore enables to maintain elasticity of the spring pieces 16A, 16B, 16C, and to keep the pads 12 in contact reliably with the respective posts 14.

Figure 5:
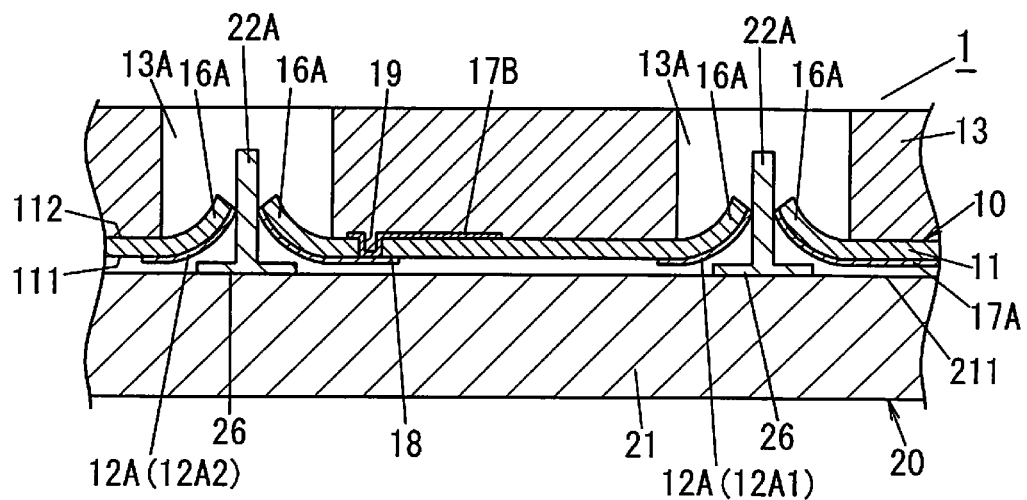
FIG. 5 is a sectional view of a main part of the connector assembly according to the embodiment with the socket attached to the header.

As shown in FIG. 5, when the socket 10 is being attached to the header 20, each connection post 22A comes into contact with the spring pieces 16A around a corresponding connection through hole 14A and is then inserted into the connection through hole 14A while elastically deforming the spring pieces 16A to widen the connection through hole 14A. The spring pieces 16A around each connection through hole 14A press, by their elastic force, a corresponding connection pad 12A against a side surface of a corresponding connection post 22A, and thereby each connection post 22A is electrically connected with a corresponding connection pad 12A. As similar with this, each attachment post 22B comes into contact with the spring pieces 16B around a corresponding attachment through hole 14B and is then inserted into the attachment through hole 14B while elastically deforming the spring pieces 16B to widen the attachment through hole 14B. The spring pieces 16B around each attachment through hole 14B press, by their elastic force, a corresponding attachment pad 12B against a side surface of a neck portion 23 of a corresponding attachment post 22B, and thereby each attachment post 22B is electrically connected with a corresponding pad 12B. Also, each positioning post 22C comes into contact with the spring pieces 16C around a corresponding positioning through hole 14C and is then inserted into the positioning through hole 14C while elastically deforming the spring pieces 16C to widen the positioning through hole 14C. The spring pieces 16C around the positioning through hole 14C press, by their elastic force, a corresponding positioning pad 12C against a side surface of a large diameter portion 25a of a corresponding positioning post 22C, and thereby each positioning post 22C is electrically connected with a corresponding positioning pad 12C.

As shown in the figures, the connection post 22A has a substantially constant in outer diameter for the entire length thereof in the upright direction, and has no protrusion contrary to the attachment post 22B. Therefore, the connection post 22A little contributes for the mechanical connection between the socket 10 and the header 20, since the connection post 22A has no part hooked to the connection pad 12A when the connection post 22A is inserted into the connection through hole 14A. On the other hand, the attachment post 22B is shaped like a mushroom with the head portion 24 at a tip side being thicker than the neck portion 23 at a base side. When the socket 10 is attached to the header 20, the spring pieces 16B climb over the corresponding head portion 24 to come into contact with the neck portion 23. Therefore, the attachment post 22B is prevented from being fallen off since the tips of the spring pieces 16B are hooked to the head portion 24 of the corresponding attachment post 22B, and thereby the socket 10 and the header 20 are mechanically connected with each other. In the embodiment, the gap between the large diameter portion 25a of the positioning post 22C and the through hole 13C is set to be narrower than the gap between the connection post 22A and the through hole 13A. Therefore, the socket 10 is relatively positioned with the header 20 when the positioning posts 22C are inserted into the through holes 13C. Note that, at least one connection post 22A may be shaped like a mushroom as with the attachment post 22B. In this configuration, the socket 10 and the header 20 can be connected with each other through the connection post 22A.

When the socket 10 is being withdrawn from the header 20, each attachment post 22B is withdrawn from a corresponding attachment through hole 14B while elastic deforming spring pieces 16B around the attachment through hole 14B to widen the attachment through hole 14B. When the socket 10 and the header 20 are withdrawn with relatively large strength, although once the tips of the spring pieces 16B are hooked to the head portion 24, the spring pieces 16B elastic deform and the tips thereof can climb over the head portion 24. As a result, each attachment post 22B can be withdrawn from a corresponding attachment through hole 14B. On the other hand, each connection post 22A is shaped like a column having a substantially constant diameter for the entire length in the upstanding direction, and each positioning post 22C has a tip portion the diameter of which is smaller than that of a base portion. Therefore, when the socket 10 is withdrawn from the header 20, spring pieces 16A, 16C around each of the through holes 14A, 14C do not hook to a corresponding post 22A, 22C. The posts 22A, 22C therefore can be easily withdrawn from the respective through holes 14A, 14C.

When a user wants to attach the socket 10 to the header 20, the user has only to make the surface of the socket 10 on which the pads 12 are formed face the header substrate 21; align the relative positions between the through holes 14 and the posts 22, respectively; and then press the film substrate 11 against the header substrate 21. With this process, the connection posts 22A are inserted into the respective connection through holes 14A to be electrically connected with the respective pads 12A, and thereby the socket 10 and the header 20 are electrically connected with each other. In addition, the attachment posts 22B are inserted into the respective attachment through holes 14B to be electrically connected with the respective pads 12B, and thereby the socket 10 and the header 20 are electrically connected with each other; as well as the attachment posts 22B are retained by the head portions 24 being hooked with the spring pieces 16B around the attachment through holes 14B, and thereby the socket 10 and the header 20 are mechanically connected with each other. In addition, the spring pieces 16C around the positioning through holes 14C make contact with the respective large diameter portions 25a of the positioning post 22C, and thereby the socket 10 and the header 20 are relatively positioned each other.

When a user wants to detach the socket 10 from the header 20, the user has only to withdraw the film substrate 11 from the header substrate 21. With this process, the attachment posts 22B are withdrawn from the respective attachment through holes 14B, and thereby the socket 10 is mechanically disconnected from the header 20. In addition, the posts 22 (22A, 22B, 22C) are withdrawn from the respective through holes 14 (14A, 14B, 14C) and therefore the posts 22 (22A, 22B, 22C) are separated from the respective pads 12 (12A, 12B, 12C), and thereby the socket 10 is electrically disconnected from the header 20.

As described above, the connector assembly 1 of the embodiment includes the socket 10 (female connector) and the header 20 (male connector). The socket 10 includes the film substrate 11 and the connection pads 12A (pads). The film substrate 11 is constituted by a flexible thin board made of insulation material, and is provided with the connection through holes 14A (through holes) penetrating the film substrate 11 in the thickness direction. Each of the connection pads 12A has electrical conductivity. The connection pads 12A are formed on the first surface 111 of the film substrate 11 around the respective connection through holes 14A. The header 20 includes the connection posts 22A (conductive protrusions). Each of the connection posts 22A is adapted to be inserted into a corresponding connection through hole 14A to push and elastically deform the periphery of the connection through hole 14A, thereby being electrically connected with a corresponding connection pad 12A, when the header 20 is being connected with the socket 10. The connection pads 12A include the first pad 12A1 and the second pad 12A2. The film substrate 11 is provided on the first surface 111 with the first patterned conductor 17A provided correspondingly to the first pad 12A1 and the third patterned conductor 18 provided correspondingly to the second pad 12A2. The first patterned conductor 17A is electrically connected with the corresponding first pad 12A1. The third patterned conductor 18 is electrically connected with the corresponding second pad 12A2. The film substrate 11 is provided on the second surface 112 with the second patterned conductor 17B provided correspondingly to the third patterned conductor 18. The second patterned conductor 17B is electrically connected with the corresponding third patterned conductor 18 (and with the corresponding second pad 12A2). The third patterned conductor 18 is electrically connected to the corresponding second patterned conductor 17B by means of the blind via 19 that is formed by boring the film substrate 11 from the second surface 112 so as to reach the third patterned conductor 18.

Described in other words, the connector assembly 1 of the embodiment includes the socket 10 (female connector) and the header 20 (male connector). The socket 10 includes the film substrate 11 and the connection pads 12A (pads). The film substrate 11 is constituted by a flexible thin board made of insulation material, and is provided with the connection through holes 14A (through holes) penetrating the film substrate 11 in the thickness direction. The connection pads 12A are formed on the front surface (first surface 111) of the film substrate 11 respectively around the connection through holes 14A. The header 20 includes the connection posts 22A (conductive protrusions). Each of the connection posts 22A is adapted to be inserted into a corresponding connection through hole 14A to push and elastically deform the periphery of the connection through hole 14A to be electrically connected with a corresponding connection pad 12A, when the header 20 is being connected with the socket 10. The film substrate 11 is provided on the front surface (first surface 111) with the patterned conductors (first patterned conductor 17A and third patterned conductor 18) electrically connected respectively with the connection pads 12A. The patterned conductor 18 (i.e. a part of the patterned conductors 17A, 18) is electrically connected to the patterned conductor 17B (second patterned conductor) formed on the back surface (second surface 112) of the film substrate 11. The patterned conductor 18 is connected to the patterned conductor 17B by means of the blind via 19 that is formed by boring the film substrate 11 from the back surface (second surface 112) side so as to reach the patterned conductor 18, thereby being electrically connected to the patterned conductor 17B.

According to the embodiment, the patterned conductor 18 (i.e. a part of the patterned conductors connected to the connection pads 12A) is electrically connected to the patterned conductor 17B formed on the back surface (second surface 112) of the film substrate 11 by means of the blind via 19 that is formed from the back surface (second surface 112) side of the film substrate 11. The embodiment therefore can downsize the film substrate 11 compared with a case where all patterned conductors connected to the pads 12A are formed on the front surface (first surface 111) of the film substrate 11. In addition, since the blind via 19 does not penetrate the film substrate 11, the mask layer can be formed on the front surface (first surface 111) of the film substrate 11 after boring the film substrate 11 from the back surface (second surface 112) side so as to reach the patterned conductor 18. That is, the film substrate 11 can be subjected the plating process under the condition where a mask is provided on the front surface (first surface 111). Accordingly, the pads 12A formed on the front surface (first surface 111) of the film substrate 11 around the through holes 14A are not plated (i.e. plated layer is not formed on the pads 12A), and therefore the pads 12A are prevented from being thickened by the plated layer. As a result, the pads 12A can be bent freely when the socket 10 is connected to the header 20, and accordingly the present embodiment can reduce the stress occurring in the pads 12A when the pads 12A are bent by the connection posts 22A.

In the connector assembly of the embodiment, the connection through holes 14A (through holes) are arranged in the film substrate 11 in a plurality of rows (along lines), each row extends (in parallel) in one direction. The connection pads 12A are formed to the connection through holes 14A, respectively. In each row, the connection through holes 14A are spaced with a predetermined interval.

In the embodiment, the connection pads 12A are formed along a plurality of lines, and the third patterned conductors 18 connected with a part (12A2) of the connection pads 12A are connected with the patterned conductors 17B on the back surface (second surface 112) by means of the blind via 19, respectively, and accordingly the connector assembly 1 can be downsized. Since the patterned conductors 18 are connected to the respective patterned conductors 17B of the back surface (second surface 112) by means of the blind vias 19, the film substrate 11 can be subjected the plating process for forming the blind vias 19 with a condition of providing a mask on the front surface (first surface 111). In the embodiment, the pads 12A are prevented from being thickened by the plated layer and the pads 12A can be bent freely, and accordingly the present embodiment can reduce the stress occurring in the pads 12A.

In the connector assembly of the embodiment, the socket 10 (female connector) includes the reinforcing plate 13 fixed to the second surface 112 of the film substrate 11. The reinforcing plate 13 is adhered to the film substrate 11 by means of epoxy adhesive.

According to this configuration, the reinforcing plate 13 is firmly adhered to the film substrate 11, and in particular, the root portions of the spring pieces 16A, 16B, 16C are firmly adhered to the reinforcing plate 13 to be prevented from being detached. This configuration therefore enables to maintain high elasticity of the spring pieces 16A, 16B, 16C, and to keep the pads 12 in contact reliably with the respective posts 14.

The socket 10 (female connector) of the embodiment is adapted to be used for the connector assembly 1, and includes the film substrate 11 and the connection pads 12A (pads). The film substrate 11 is constituted by a flexible thin board made of insulation material, and is provided with the connection through holes 14A (through holes) penetrating the film substrate 11 in the thickness direction. Each of the connection pads 12A has electrical conductivity. The connection pads are formed on the first surface 111 of the film substrate 11 around the respective connection through holes 14A. The connection pads 12A include the first pad 12A1 and the second pad 12A2. The film substrate 11 is provided on the first surface 111 with the first patterned conductor 17A provided correspondingly to the first pad 12A1 and the third patterned conductor 18 provided correspondingly to the second pad 12A2. The first patterned conductor 17A is electrically connected with the corresponding first pad 12A1. The third patterned conductor 18 is electrically connected with the corresponding second pad 12A2. The film substrate 11 is provided on the second surface 112 with the second patterned conductor 17B provided correspondingly to the third patterned conductor 18. The second patterned conductor 17B is electrically connected with the corresponding third patterned conductor 18 (and with the corresponding second pad 12A2). The third patterned conductor 18 is electrically connected to the corresponding second patterned conductor 17B by means of the blind via 19 that is formed by boring the film substrate 11 from the second surface 112 so as to reach the third patterned conductor 18.

Described in other words, the socket 10 (female connector) of the embodiment is adapted to be used for the connector assembly 1, and includes the film substrate 11 and the connection pads 12A (pads). The film substrate 11 is constituted by a flexible thin board made of insulation material, and is provided with the connection through holes 14A (through holes) penetrating the film substrate 11 in the thickness direction. The connection pads 12A are formed on the front surface (first surface 111) of the film substrate 11 respectively around the connection through holes 14A. The film substrate 11 is provided on the front surface (first surface 111) with the patterned conductors (first patterned conductor 17A and third patterned conductor 18) electrically connected respectively with the connection pads 12A. The patterned conductor 18 (i.e. a part of the patterned conductors 17A, 18) is electrically connected to the patterned conductor 17B (second patterned conductor) formed on the back surface (second surface 112) of the film substrate 11. The patterned conductor 18 is connected to the patterned conductor 17B by means of the blind via 19 that is formed by boring the film substrate 11 from the back surface (second surface 112) side so as to reach the patterned conductor 18, thereby being electrically connected to the patterned conductor 17B.

According to the embodiment, the patterned conductor 18 (i.e. a part of the patterned conductors connected to the connection pads 12A) is electrically connected to the patterned conductor 17B formed on the back surface (second surface 112) of the film substrate 11 by means of the blind via 19 that is formed from the back surface (second surface 112) side of the film substrate 11. The embodiment therefore can downsize the film substrate 11 compared with a case where all patterned conductors connected to the pads 12A are formed on the front surface (first surface 111) of the film substrate 11. In addition, since the blind via 19 does not penetrate the film substrate 11, the mask layer can be formed on the front surface (first surface 111) of the film substrate 11 after boring the film substrate 11 from the back surface (second surface 112) side so as to reach the patterned conductor 18. That is, the film substrate 11 can be subjected the plating process under the condition where a mask is provided on the front surface (first surface 111). Accordingly, the pads 12A formed on the front surface (first surface 111) of the film substrate 11 around the through holes 14A are not plated (i.e. plated layer is not formed on the pads 12A), and therefore the pads 12A are prevented from being thickened by the plated layer. As a result, the pads 12A can be bent freely when the socket 10 is connected to the header 20, and accordingly the present embodiment can reduce the stress occurring in the pads 12A when the pads 12A are bent by the connection posts 22A.

The embodiment does not limit the materials and dimensions of the components for the connector assembly 1 to those exemplified in the above description, and they can be appropriately modified in accordance with desired features and performance.

The invention claimed is:

1. A connector assembly comprising: a female connector; and a male connector, wherein the female connector comprises a film substrate and pads, the film substrate being constituted by a flexible thin board made of insulation material and provided with hollow through holes each penetrating the film substrate entirely in a thickness direction of the film substrate, the pads having electrical conductivity and being formed on a first surface of the film substrate around the respective through holes, wherein the male connector comprises conductive protrusions, each of the conductive protrusions being configured to be inserted into a corresponding through hole to push and elastically deform periphery of the through hole, thereby being electrically connected with a corresponding pad, when the male connector is connected with the female connector, wherein the pads include a first pad and a second pad, wherein the film substrate is provided on the first surface thereof with: a first patterned conductor provided correspondingly and electrically connected to the first pad; and a third patterned conductor provided correspondingly and electrically connected to the second pad, the first surface being a first outer surface, wherein the film substrate is provided on a second surface thereof with a second patterned conductor provided correspondingly and electrically connected to the third patterned conductor, the second surface being a second outer surface, which is opposite the first outer surface, wherein the third patterned conductor is electrically connected to the corresponding second patterned conductor by means of a blind via that is formed adjacent the corresponding second pad and separately from the through hole and that is formed by boring the film substrate from the second surface so as to reach the third patterned conductor, the blind via being hollow and having a closed bottom, wherein the conductive protrusion is not inserted into the blind via, and wherein the bottom of the blind via is flush with the second surface of the film substrate.

2. The connector assembly as set forth in claim 1, wherein the through holes are arranged in the film substrate in a plurality of rows, and wherein the pads are formed so as to correspond to the respective through holes.

3. The connector assembly as set forth in claim 1, wherein the female connector further includes a reinforcing plate fixed to the second surface of the film substrate, and wherein the reinforcing plate is adhered to the film substrate by means of epoxy adhesive.

4. A female connector, configured to be connected to a male connector that comprises conductive protrusions,
   wherein the female connector comprises a film substrate and pads, the film substrate being constituted by a flexible thin board made of insulation material and provided with hollow through holes each penetrating the film substrate entirely in a thickness direction of the film substrate, the pads having electrical conductivity and being formed on a first surface of the film substrate around the respective through holes,
   wherein the pads of the female connector include at least one first pad and at least one second pad,
   wherein the film substrate is provided on the first surface thereof with: a first patterned conductor provided correspondingly and electrically connected to the first pad; and a third patterned conductor provided correspondingly and electrically connected to the second pad, the first surface being a first outer surface,
   wherein the film substrate is provided on a second surface thereof with a second patterned conductor provided correspondingly and electrically connected to the third patterned conductor, the second surface being a second outer surface, which is opposite the first outer surface,
   wherein the third patterned conductor is electrically connected to the corresponding second patterned conductor by means of a blind via that is formed adjacent the corresponding second pad and separately from the through hole and that is formed by boring the film substrate from the second surface so as to reach the third patterned conductor so that a bottom of the blind via is flush with the second surface of the film substrate, the blind via being hollow with the bottom of the blind via being closed, and
   wherein each of the conductive protrusions of the male connector is configured to be inserted into a corresponding through hole to push and elastically deform periphery of the through hole, thereby being electrically connected with a corresponding pad, and the conductive protrusion is not inserted into the blind via, when the male connector is connected with the female connector.

5. The connector assembly as set forth in claim 1, wherein the third patterned conductor extends from a corresponding second pad,
   wherein part of the third patterned conductor overlaps part of the corresponding second patterned conductor in the thickness direction of the film substrate, and
   wherein the blind via that electrically connects the third patterned conductor with the corresponding second patterned conductor extends in the thickness direction of the film substrate.

6. The female connector as set forth in claim 4, wherein the third patterned conductor extends from a corresponding second pad,
   wherein part of the third patterned conductor overlaps part of the corresponding second patterned conductor in the thickness direction of the film substrate, and
   wherein the blind via that electrically connects the third patterned conductor with the corresponding second patterned conductor extends in the thickness direction of the film substrate.

7. A connector assembly according to claim 1, wherein the third patterned conductor is only connected between the corresponding second pad and the corresponding second patterned conductor by the corresponding blind via.

8. A female connector according to claim 4, wherein the third patterned conductor is only connected between the corresponding second pad and the corresponding second patterned conductor by the corresponding blind via.

* * * * *